United States Patent
Wang et al.

(10) Patent No.: US 6,767,778 B2
(45) Date of Patent: Jul. 27, 2004

(54) LOW DOSE SUPER DEEP SOURCE/DRAIN IMPLANT

(75) Inventors: Zhongze Wang, Boise, ID (US); Inna V. Patrick, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/230,809

(22) Filed: Aug. 29, 2002

(65) Prior Publication Data

US 2004/0041170 A1 Mar. 4, 2004

(51) Int. Cl.[7] .......................................... H01L 21/8234
(52) U.S. Cl. .................. 438/197; 438/216; 438/286; 438/261
(58) Field of Search .................. 438/197, 301, 438/303, 305–307, 954, 981, 585, 286, 216, 261; 257/344, 408, 411, 412

(56) References Cited

U.S. PATENT DOCUMENTS

| | | | |
|---|---|---|---|
| 5,350,698 A | * | 9/1994 | Huang et al. ............... 438/305 |
| 5,405,788 A | | 4/1995 | Manning et al. |
| 5,595,919 A | | 1/1997 | Pan |
| 5,793,090 A | * | 8/1998 | Gardner et al. ............. 257/408 |
| 5,998,849 A | * | 12/1999 | Ishimaru et al. ............ 257/410 |
| 6,180,472 B1 | * | 1/2001 | Akamatsu et al. .......... 438/303 |
| 6,200,879 B1 | | 3/2001 | Tyagi |
| 6,218,226 B1 | * | 4/2001 | Lin et al. .................... 438/200 |
| 6,365,472 B1 | * | 4/2002 | Ishimaru et al. ............ 438/301 |

OTHER PUBLICATIONS

E. Augendre, A. De Keersgieter, S. Kubicek, A. Redolfi, J. Van Laer and G. Badenes; Arsnic and Phosphorus co–Implantation for Deep Submicron CMOS Gate and Source/Drain Engineering; 4 pages; Belgium.

Jan–Kwan Park, H.V. Deshpande and J.C.S. Woo; The Effect of Impact Ionization on the Subthreshold Leakage Current in N–Channel Double–Gate SOI Transistors; 4 pages; Department of Electrical Engineering; California.

* cited by examiner

Primary Examiner—Long Pham
Assistant Examiner—Nathan W. Ha
(74) Attorney, Agent, or Firm—Dinsmore & Shohl LLP

(57) ABSTRACT

A semiconductor device for reducing junction capacitance by an additional low dose super deep source/drain implant and a method for its fabrication are disclosed. In particular, the super deep implant is performed after spacer formation to significantly reduce junction capacitance in the channel region.

18 Claims, 5 Drawing Sheets

LOW DOSE SUPER DEEP SOURCE/DRAIN IMPLANT

BACKGROUND OF THE INVENTION

The invention relates to the fabrication of integrated circuit devices, and more particularly, to a semiconductor device having reduced junction capacitance by an additional low dose super deep source/drain implant, and to a method for fabricating such a device.

As the semiconductor industry progresses to even smaller sub-micron dimensions, continued advances in manufacturing techniques are required to provide submicron semiconductor devices with acceptable electrical characteristics. As CMOS gate lengths are reduced, the risk of a short-channel effect, called punch-through, rises. Punch-through is a circuit breakdown in which the drain voltage reaches a sufficiently large value that the depletion layer associated with the drain spreads across the substrate and reaches the source. This causes a destructive source/drain conduction path or leakage current.

Various approaches have been taken to avoid short-channel effects. One technique for avoiding punch-through is to raise the well or substrate dopant concentration, reducing the size of the depletion region so that punch-through does not occur when a voltage is applied. However, increasing the well concentration has drawbacks. The high substrate doping level causes a high source/drain junction capacitance, a low junction breakdown voltage, an increase in transistor threshold voltage, and high body effects. Furthermore, a high well concentration reduces carrier mobility, leading to a lowering of drive current.

Anti-punchthrough (APT) implants have been developed as an alternative to raising the dopant concentration generally throughout the well or substrate. APT implants increase dopant concentrations only near the channel and source/drain region, not throughout the entire substrate. Examples of such APT implants are halo implants and pocket implants, which are illustrated by FIG. 1.

Over a semiconductor substrate 10, a polycide gate 11 is formed. Heavily doped source and drain (HDD) regions 24 and lightly doped source and drain (LDD) regions 30 have been implanted. On a respective side of the polycide gate 11, for convenience of illustration, there is either a halo implant 17 or a pocket implant 34. The halo implant 17 is a self-aligned implant in which the polycide gate 11 acts as a mask during implant. The halo implant 17 is performed with a dopant opposite to that of the implant in the LDD regions 30. As illustrated, the halo implant 17 is deeper both vertically and laterally than its respective LDD region 30.

The pocket implant 34 is also a self-aligned implant in which a small pocket of a heavy dopant concentration is formed adjacent the LDD regions 30 to block the potential leakage path while allowing the channel region 15 to maintain a lower dopant concentration. In particular, the pocket implant 34 raises dopant concentrations only where the increased doping is needed, rather than raising the well concentration uniformly throughout the substrate 10, as is the case with the halo implant 17.

However, providing a pocket implant under the LDD regions by conventionally known methods, such as disclosed by U.S. Pat. No. 5,595,919, is both complicated and expensive by requiring additional processing steps, which adds production cost to the integrated circuit device. Accordingly, the present inventors have recognized a need for further improvements in semiconductor processing to provide reduce junction capacitance in the fabrication of integrated circuits by less complicated methods, requiring fewer processing steps, thereby reducing production costs.

SUMMARY OF THE INVENTION

The present invention is a sub-micron semiconductor device addressing junction capacitance through the use of a super deep but low dose source/drain implant performed in addition to source/drain implantation as well as a method of fabricating such a device. The super deep source/drain implant (i.e., implantation greater than about 0.25 $\mu$m) is performed after spacer formation to significantly reduce junction capacitance in the channel region. Although junction depth increases, there is a de minimis effect on the channel such that device performance is not sacrificed by the low dose super deep implant. The implantation process of the present invention may be applied to both n-channel and p-channel transistors.

In accordance with one embodiment, a method for fabricating semiconductor devices comprises providing a substrate, forming active areas on the substrate, isolating the active areas with a field oxide, and forming polycide gates having spacers in the active areas. The method further comprises implanting a first dopant at low energy into the substrate. The first dopant has a dosage sufficient to form a heavily doped source/drain region in the substrate adjacent the nitride spacers. The method further comprises implanting a second dopant comprising the same conductivity type as the first dopant but at a lower dosage and with greater energy to form a deeper lightly doped source/drain region in the substrate below the heavily doped source/drain region. Continuing processing is performed to form an active semiconductor device in the active areas.

In another embodiment of the invention, a method of fabricating an integrated circuit device having reduced junction capacitance comprises providing a layer of a field oxide over the surface of a semiconductor substrate, forming a gate electrode overlying the field oxide layer, and forming a silicon oxide layer having sidewalls on the surface and sidewalls of the gate electrode. The method further comprises forming silicon nitride spacers on the sidewalls of the silicon oxide sidewall layer, and implanting first ions having a first dosage and a first energy into the substrate to form a heavily doped source/drain region in the substrate adjacent the silicon nitride spacers. The method further comprises implanting second ions having the same conductivity type as the first ions, but at a second dosage lower than the first dosage and with a second energy greater than the first energy, to form a deeper lightly doped source/drain region in the substrate below the heavily doped source/drain region. The method further comprises annealing the substrate, and removing the silicon nitride spacers. The method further comprises implanting third ions with a third dosage at a third energy into the substrate to form lightly doped regions in the semiconductor substrate. Continuing processing is performed to fabricate the integrated circuit device.

In still other embodiment of the invention, a method of fabricating an integrated circuit device having reduced junction capacitance comprises providing a layer of a gate oxide over the surface of a semiconductor substrate. A gate electrode is formed overlying the gate oxide layer. The method further comprises forming a silicon oxide layer having sidewalls on the surface and sidewalls of the gate electrode, and implanting first ions with a first dosage at a first energy into the substrate to form lightly doped regions in the semiconductor substrate adjacent the gate electrode. The method further comprises forming silicon nitride spacers on the sidewalls of the silicon oxide sidewall layer, and implanting second ions having a second dosage and at a second energy into the substrate to form a heavily doped source/drain region in the substrate adjacent the silicon nitride spacers. Third ions are implanted having the same conductivity type as the first ions but at a third dosage lower than the second dosage and with a third energy greater than the third energy to form a deeper lightly doped source/drain region in the substrate below the heavily doped source/drain region. The method further comprises annealing the substrate, and continuing processing to fabricate the integrated circuit device.

In yet another embodiment, an integrated circuit device having reduced junction capacitance comprises a gate electrode overlying a gate silicon oxide layer on a surface of a semiconductor substrate, a silicon oxide layer lying on a surface and sidewalls of the gate electrode, and silicon nitride spacers on the sidewalls of the silicon oxide sidewall layer. Lightly doped source and drain regions lie within the semiconductor substrate not covered by the gate electrode and the silicon oxide sidewall layer. Heavily doped source and drain regions lie within the semiconductor substrate not covered by the gate electrode, the silicon oxide sidewall layer, and the nitride spacers adjacent to the lightly doped source and drain regions. Deeper lightly doped source and drain regions underlie the heavily doped source and drain regions within the semiconductor substrate.

In still yet another embodiment, an integrated circuit device having reduced junction capacitance comprises a gate electrode overlying a gate silicon oxide layer on a surface of a semiconductor substrate, a silicon oxide layer lying on a surface and sidewalls of the gate electrode. Lightly doped source and drain regions lie within the semiconductor substrate not covered by the gate electrode and the silicon oxide sidewall layer. Heavily doped source and drain regions lie within the semiconductor substrate adjacent to the lightly doped source and drain regions. Deeper lightly doped source and drain regions underlie the heavily doped source and drain regions within the semiconductor substrate.

These and other features and advantages of the invention will be more filly understood from the following description of some embodiments of the invention taken together with the accompanying drawings. It is noted that the scope of the claims is defined by the recitations therein and not by the specific discussion of features and advantages set forth in the present description.

BRIEF DESCRIPTION OF THE DRAWINGS

The following detailed description of the embodiments of the present invention can be best understood when read in conjunction with the following drawings, where like structure is indicated with like reference numerals and in which.

DETAILED DESCRIPTION OF THE PREFERRED EMBODIMENTS

A sub-micron semiconductor device having reduced junction capacitance and method of fabricating such a device is described. The device includes a super deep, low dose, source and drain implant performed in addition to source/drain implantation is disclosed. In the following description, numerous specific details are set forth such as specific materials, reticle patterns, dimensions, etc. in order to provide a thorough understanding of the present invention. It will be obvious, however, to one skilled in the art that these specific details need not be employed to practice the present invention. In other instances, known materials or methods are not described in detail to avoid unnecessarily obscuring the present invention.

Further, it should be noted that the process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing portions of an integrated circuit during fabrication are not drawn to scale, but instead are drawn to illustrate features of the invention.

It should be noted that although the following description describes embodiments showing only the N-channel metal oxide field effect transistor (MOSFET) portion of a CMOS integrated circuit device, other arrangements of p-type wells, n-type wells, and combinations of the two with many different doping levels may be used and still preserve the essence of the present invention. Moreover, it is well understood by those skilled in the art that the P-channel portion of a CMOS integrated circuit device can be formed by simply substituting opposite polarities to those given for the N-channel embodiments.

Figure 1:
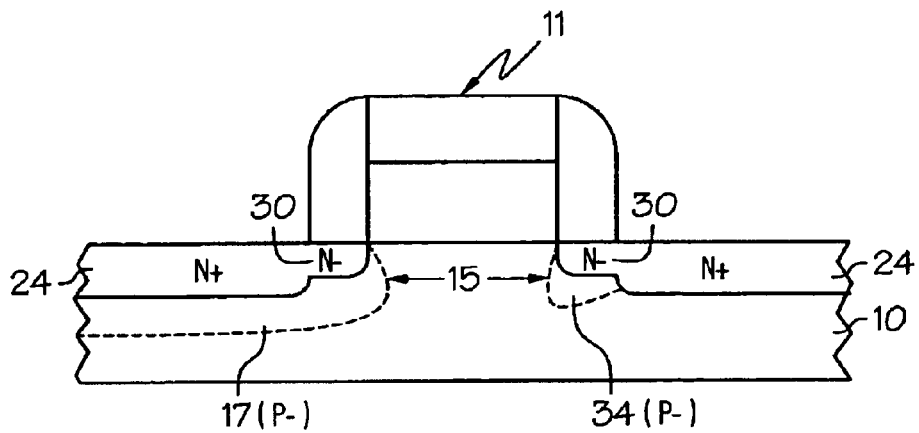
FIG. 1 schematically illustrates in cross-sectional representation, anti-punchthrough (APT) implants of the prior art.
Figure 2:
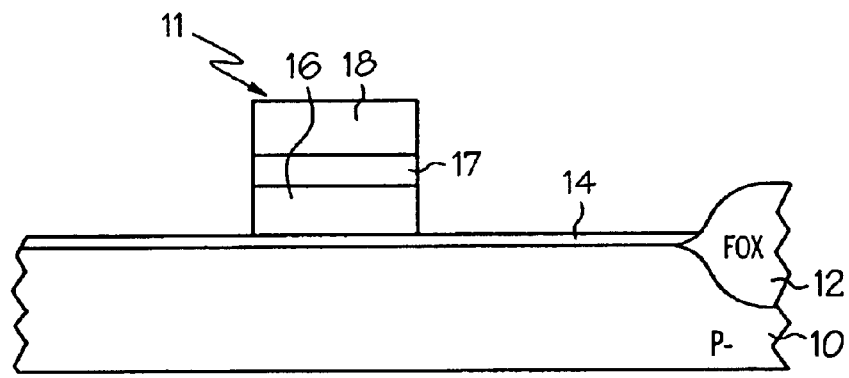
FIGS. 2 through 9 schematically illustrate in cross-sectional representation a process for reducing junction capacitance of a semiconductor device having DSD regions in accordance with the present invention.

Referring now more particularly to FIG. 2, there is shown an illustration of the N-channel portion of a partially completed polycide gate structure 11 of a MOSFET.

The process begins with shallow trench isolation of a substrate 10, which can be any semiconductor material, including, for example, gallium arsenide (GaAs), silicon (Si), and germanium (Ge) to form isolated active areas of the substrate 10. If desired, field oxide regions 12 may also be provided to the active areas for the same purpose. The surface of the substrate 10 is then thermally oxidized to form the gate oxide 14 to a desired thickness. The thickness of gate oxide 14 may be from about 15 to about 200 Angstroms.

The polysilicon layer 16 is deposited by low-pressure chemical vapor deposition (LPCVD) to a thickness of between about 300 to about 3000 Angstroms. A polycide layer 17 is deposited by PECVD to a thickness of about 100 to about 1000 Angstroms. A capping or nitride dielectric layer 18 is formed over the polycide layer 17 to a thickness of between about 300 to 600 Angstroms. A layer of photoresist (not shown) is applied over the cap oxide layer 18 and patterned to form a photoresist mask where gate electrodes and/or interconnecting lines are to be formed. The polysilicon layer 16, the polycide layer 17, and the cap oxide layer 18 are etched away in areas not covered by the mask to form gate structure 11.

Figure 3:
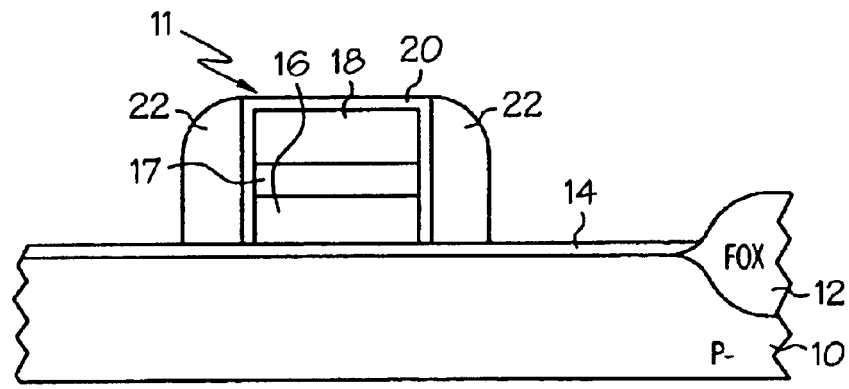

Referring now to FIG. 3, a thin oxide layer 20 is grown or deposited on the top and sidewalls of the gate structure 11 to a thickness of between about 15 to about 150 Angstroms. A dielectric layer is then deposited and partially etched away to leave spacers 22 on the sidewalls of the gate electrode, as shown in FIG. 3. The spacers 22 may have a base width from about 100 to about 1000 Angstrom, and be silicon nitride, or any other suitable spacer material. The source/drain structure of the semiconductor circuit may now be formed.

Figure 4:
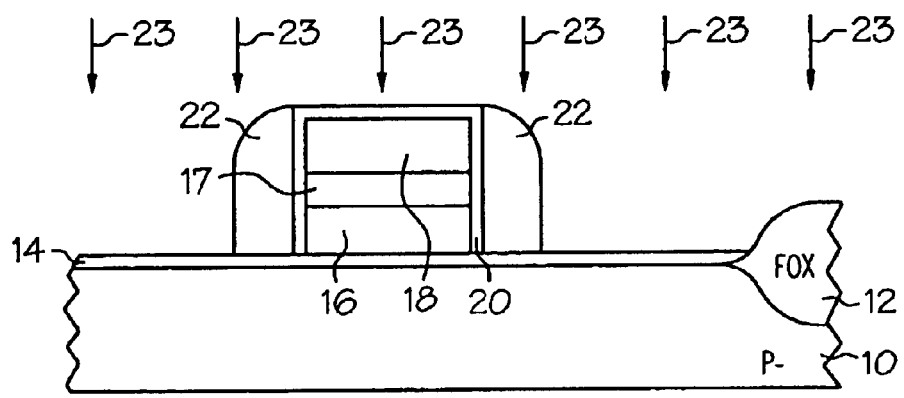

Referring now to FIG. 4, heavily doped source and drain (HDD) regions are formed by the ion implantation of N+ ions 23. Ions selected from phosphorus, arsenic, antimony ions and the like are implanted at energies within ranges that are conventional in the art to achieve a selected source and drain impurity ion amount. Typically, N+ ions are implanted at dosages of between about 1 E 14 to about 1 E 16 atoms/cm$^2$ and at energies of between about 1 to about 50 KeV. For P+ regions, boron or $BF_2$ ions are used. Heavily doped regions 24 are shown in FIG. 5.

Figure 6A:
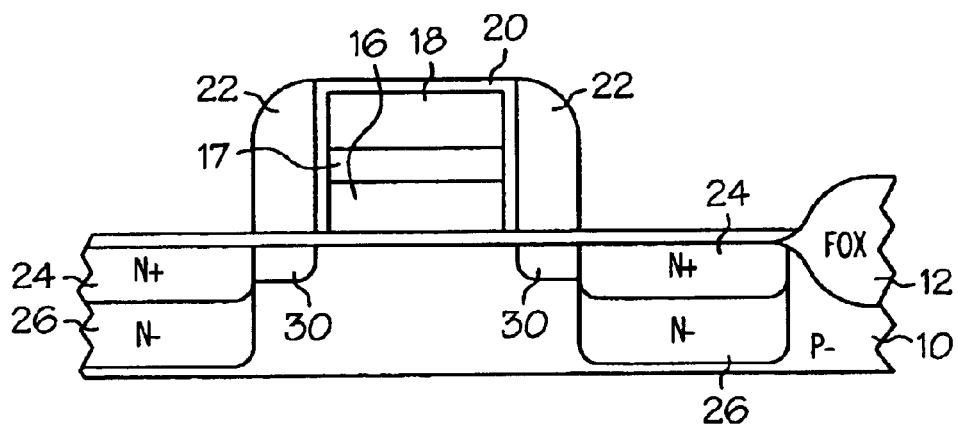
Figure 5:
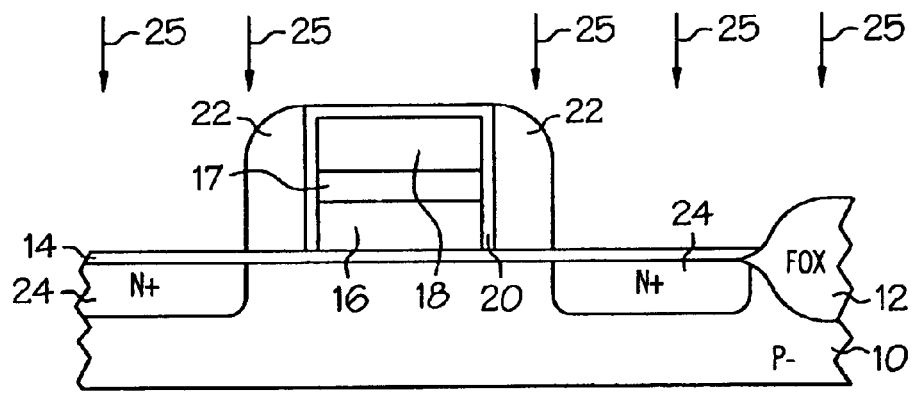
Figure 6:
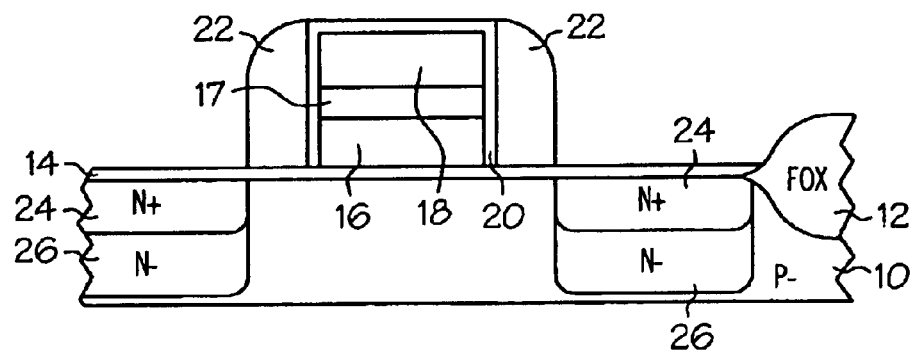

Referring now to FIGS. 5 and 6, after the HDD region implant deeper source/drain region implants are formed by implanting ions 25. Ions 25 are the same type (i.e., N+) as ions 23, but are implanted at dosages of between about 1 E 12 to about 1 E 14 atoms/cm$^2$, and at energies of between about 30 to about 100 KeV for phosphorus, and of between about 60–250 KeV for arsenic. For P+ regions, the ions are the same type ions used in the HDD P+ region implant, and are at the similar dosages. For boron implant, the energies are at between about 15 to about 50 KeV, and for BF2 energies of between 75 KeV to 250 KeV. Deeper source drain (DSD) regions 26 formed by the subsequent deep source/drain region implant are shown in FIG. 6, which significantly decrease junction capacitance in the channel region. As illustrated, the DSD regions 26 are implanted deeper into substrate 10 than the HDD regions 24. The deepest surface of the DSD N– region 26 has a depth in the range of from about 0.1 $\mu$m to about 0.5 $\mu$m. The deepest surface of the DSD P– region has a depth in the range of also from about 0.1 $\mu$m to about 0.5 $\mu$m.

The substrate 10 is then annealed, for example, at a temperature of between about 850° C. to about 1100° C. for between about 0.2 to about 30 minutes, to drive out the impurities. Those skilled in the art will appreciate that performing the deep source/drain region implant immediately after the HDD region implant, permits both processes to share the same photo mask. Accordingly, no additional photo steps are needed. However, alternatively, the subsequent DSD region implant may be carried out after annealing, wherein additional photo steps would be needed.

Further, it is to be appreciated that the above process steps may be performed before or after the photo steps for forming P-channel transistors in a CMOS device. In such an embodiment, after spacer formation and the subsequent steps (resist coating, exposure, and development) to cover the P+ source/drain regions with a resist, the above-described N+ source/drain implantation and deeper N+ source/drain implantation may be carried out.

Moreover, in any of the above described process steps, the DSD region implant may be implemented before the HDD region implantation, as long as it is after spacer 22 formation, and as long as some measures are taken to reduce channeling of the deep source/drain implant. For example, reducing channeling of the deep source/drain implant may be achieved either by a slight implantation tilt angle from about 1° to about 7° from vertical, or by a deposition of a thin layer of from about 50 to about 500 Angstroms of amorphous material (e.g. oxide, nitride) prior to implantation.

Figure 7:
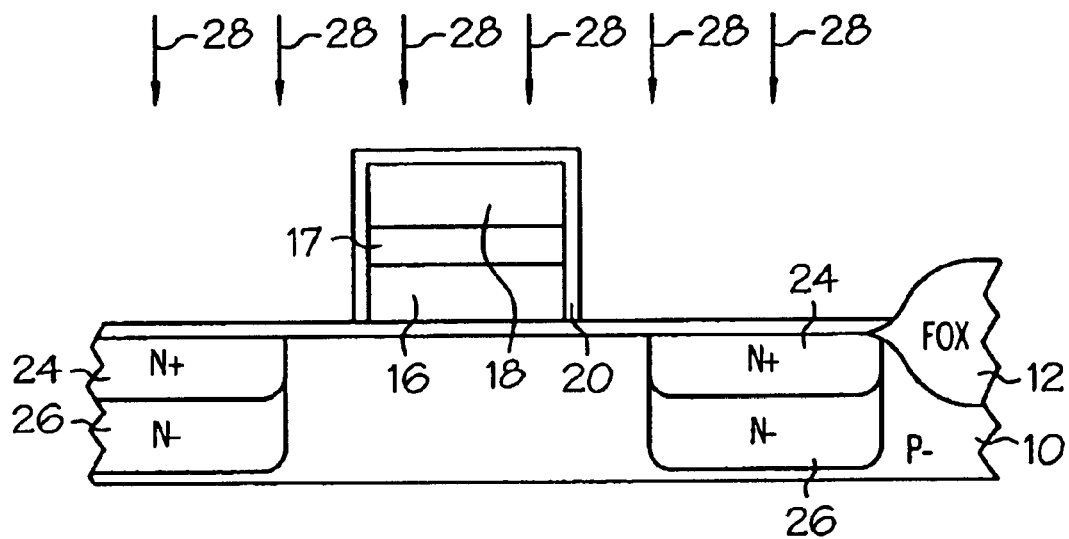
Figure 8:
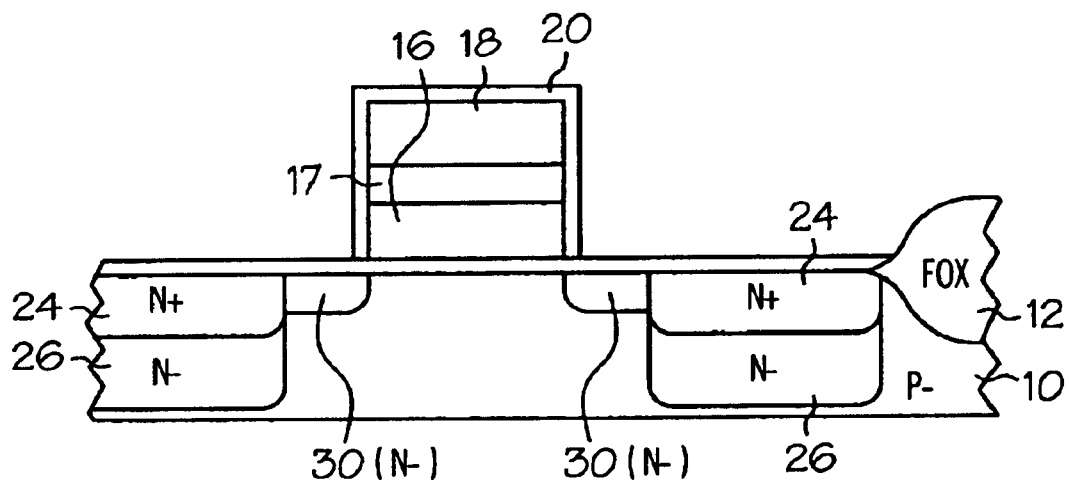

Referring to FIG. 7, next lightly doped source and drain (LDD) regions adjacent the channel region are formed in the substrate 10. In one embodiment, after removal of spacers 22, the lightly doped drain (LDD) N– regions are formed by implanting ions 28. Typically, arsenic or phosphorus ions are implanted with dosages of between about 1 E 13 to 5 E 14 atoms/cm$^2$ at energies of between about 1 to 30 KeV. The ion implantation forms lightly doped N-regions 30, as illustrated in FIG. 8. This is followed by halo implant.

Figure 2A:
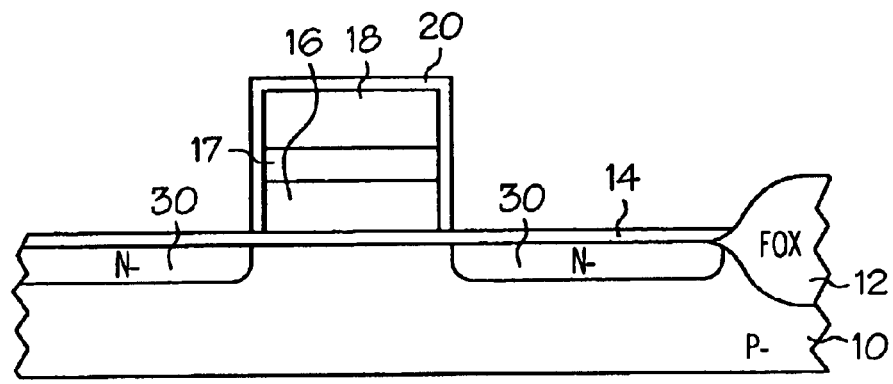

In another embodiment, the LDD regions may be formed before the formation of spacers 22. After forming the silicon oxide layer 20 on the structure illustrated by FIG. 2, the LDD N– regions 30 may be formed by implanting ions 28. Typically, arsenic or phosphorus ions are implanted with dosages of between about 1 E 13 to 5 E 14 atoms/cm$^2$ at energies of between about 1 to 30 KeV. The ion implantation forms LDD N-regions 30, as illustrated in FIG. 2A. This is followed by halo implant.

Figure 3A:
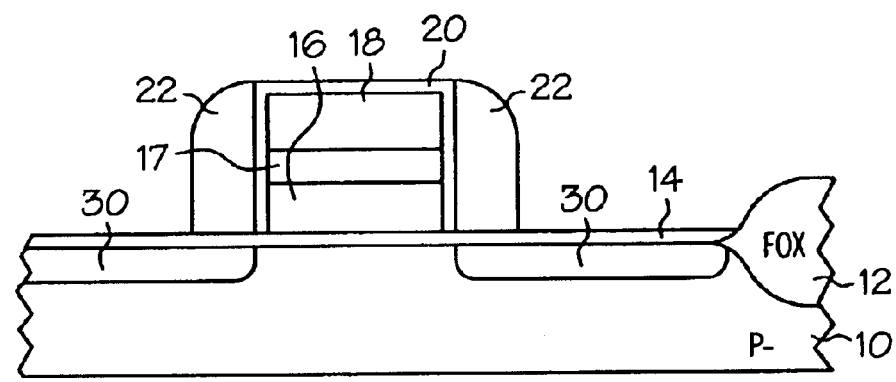

Spacers 22 are then formed over the LDD region 30 to form the structure illustrated by FIG. 3A. The HDD region implantation and DSD region 26 may be formed according to the previous process steps described with references to FIGS. 4–5, resulting in the structure illustrated by FIG. 6A.

Figure 9:
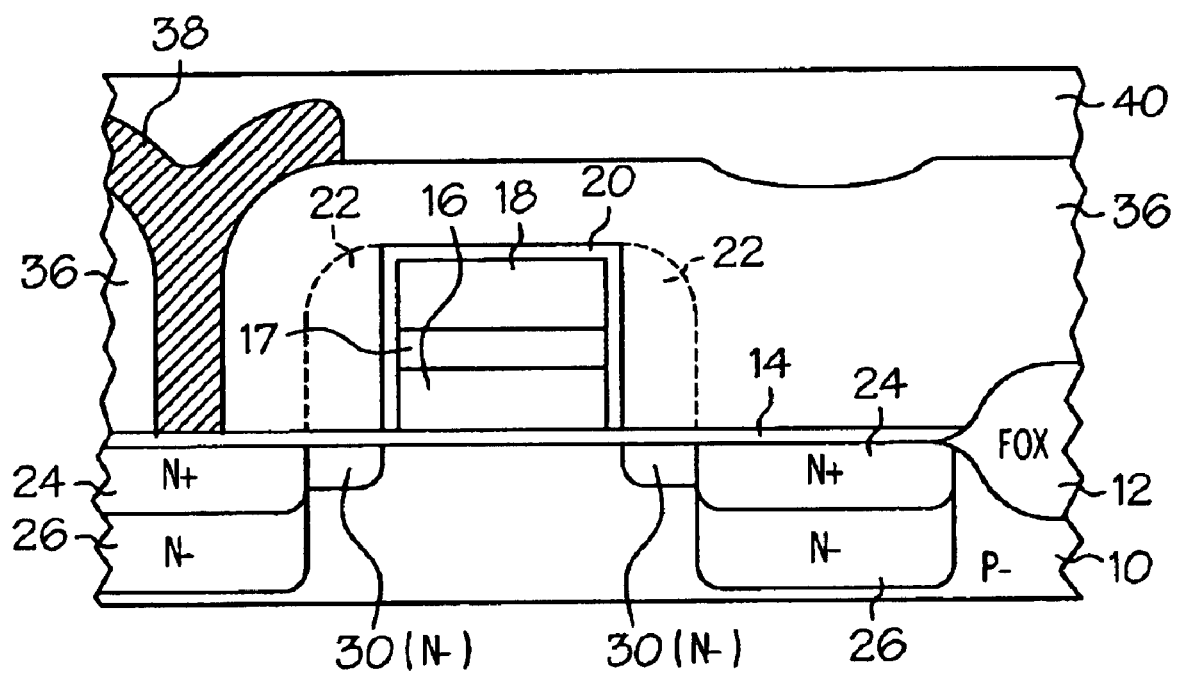

In any of the above-described embodiments, the integrated circuit device may then be completed as is conventional in the art. For example, as illustrated in FIG. 9, insulating layer 36 is deposited over the surface of the substrate, with or without spacers 22. Contact openings are made through the insulating layer to the underlying semiconductor devices, such as to a source/drain region 24. A metal layer 38 is deposited and patterned to form electrical connections between the elements of the integrated circuit. A passivation layer 40 completes the fabrication of the integrated circuit.

A sub-micron semiconductor device addressing short channel effects and junction capacitance by a super deep, low dose, source and drain implant performed in addition to source/drain implantation and method for its fabrication have been disclosed. It is to be appreciated that the method of the present invention permits improved device performance by allowing for continued device scaling. In particular, junction capacitance is inversely proportional to the depletion width of the junction. Additionally, the depletion width of the junction increases as the net doping concentration on either side of the junction decreases. The present invention addressing junction capacitance by implanting dopants deep into the source/drain regions of the substrate, which reduces the net doping concentration of the junction by compensating the substrate dopant.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a semiconductor device, comprising:

providing a substrate;

forming an active area on the substrate;

isolating the active areas; forming a polycide gate in said active areas, said polycide gate having nitride spacers formed on sidewalls thereof with an oxide layer therebetween said oxide layer also being provided on a ton surface of said polycide gate;

implanting a first dopant at a first energy into the substrate, said first dopant having a first dosage sufficient to form a heavily doped source/drain region in the substrate adjacent said nitride spacers;

implanting a second dopant comprising the same conductivity type as said first dopant but at a lower dosage than said first dosage and with second energy greater than said first energy to form a deeper doped source/drain region in the substrate below said heavily doped source/drain region; and continuing processing to form an active semiconductor device in the active areas.

2. The method as recited in claim 1, wherein the first dopant and the second dopant are p-conductivity type dopants.

3. The method as recited in claim 1, wherein the first dopant and the second dopant are n-conductivity type dopants.

4. The method as recited in claim 2, wherein the first dopant end the second dopant are selected from the group consisting of boron and $BF_2$.

5. The method as recited in claim 3, wherein the first dopant and the second dopant are selected from the group consisting of phosphorus, arsenic and the second dopant are selected from the group consisting of phosphorus, arsenic and antimony.

6. The method as recited in claim 1 wherein said second dopant is implanted before said first dopant and wherein before implantation, said method further comprises depositing an amorphous layer of about 50 to about 500 Angstroms on said substrate to reduce channeling of said second dopant.

7. The method as recited in claim 1 wherein the dosage of said second dopant is between about 1 E 12 to about 1 B 14 atoms/cm$^2$, and the dosage of said first dopant is between about 1 E 13 to I B 16 atoms/cm$^2$.

8. The method as recited in claim 1 wherein said second dopant is selected from the group consisting of phosphorus and arsenic, and said second energy is between about 30 to about 100 KeV for phosphorous, and between about 60 to about 250 KeV for arsenic.

9. The method as recited in claim 1 wherein said second dopant is selected from the group consisting of boron or $BF_2$, and said second energy is between about 15 to about 50 KeV for boron, and between about 75 to about 250 KeV for $BF_2$.

10. A method of fabricating an integrated circuit device having reduced junction capacitance comprising:

providing a gate oxide layer over a semiconductor substrate;

forming a polycide gate electrode overlying said gate oxide layer, said polycide gate electrode having a top surface and sidewalls;

forming an oxide layer on the top surface and sidewalls of said polycide gate electrode;

forming spacers adjacent the sidewalls of said polycide gate electrode on said oxide layer;

implanting first ions having a first dosage and a first energy into the substrate to form a heavily doped source/drain region in the substrate adjacent said spacers;

implanting second ions having the same conductivity type as said first ions but at a second dosage lower than said first dosage and with a second energy greater than said first energy to form a deeper doped source/drain region in the substrate below said heavily doped source/drain region;

annealing said substrate;

removing said spacers;

implanting third ions with a third dosage at a third energy into the substrate using said gate electrode and oxide layer as a mask, thereby forming lightly doped regions in said semiconductor substrate; and continuing processing to form said integrated circuit device.

11. The method as recited in claim 10 wherein said second dosage is between about 1 B 12 to about 1 B 14 atoms/cm$^2$, wherein said second ions are selected from the group consisting of phosphorus, arsenic, boron, $BF_2$, and said second energy is between about 30 to about 100 KeV for phosphorous, between about 60 to about 250 KeV for manic, between about 15 to about 50 KeV for boron, and between about 75 to about 250 KeV for $BF_2$.

12. The method as recited in claim 10 wherein said first, second, and third ions are each N$^+$ions selected from the group consisting of phosphorus, arsenic, and antimony ions.

13. The method as recited in claim 10 wherein said first ions, second ions, and third ions are each P$^+$ions selected from the group consisting of boron and $BF_2$ ions.

14. A method of fabricating an integrated circuit device having reduced junction capacitance comprising:

providing a gate oxide layer over a semiconductor substrate;

forming a polycide gate electrode overlying said gate oxide layer, said polycide gate electrode having a top surface of a protective layer and sidewalls;

forming an oxide layer on the top surface and sidewalls of said gate electrode;

implanting first ions with a first dosage at a first energy into the substrate to form lightly doped regions in said semiconductor substrate adjacent said gate electrode;

annealing said substrate;

forming nitride spacers adjacent the sidewalls of said gate electrode on the oxide layer;

implanting second ions having a second dosage and at a second energy into the substrate using the gate electrode and nitride spacers as a mask, thereby forming a heavily doped source/drain region in the substrate adjacent said nitride spacers;

implanting third ions having the same conductivity type as said first ions but at a third dosage lower than said second dosage and with a third energy greater than said second energy into the substrate using the gate electrode and nitride spacers as a mask, thereby a deeper doped source/drain region in the substrate below said heavily doped source/drain region;

annealing said substrate; and continuing processing to form said integrated circuit device.

15. A method for fabricating a semiconductor device, comprising the steps of:

a) forming a gate oxide layer, a gate electrode having a top surface and sidewalls, and an oxide layer on the top surface end sidewalls of the gate electrode in this order on a semiconductor substrate;

b) depositing a dielectric layer over the substrate and etching the dielectric layer such that spacers are formed adjacent respective sides of the gate electrode on the oxide layer and leaving the oxide layer on the top surface of the gate electrode thereon;

c) implanting first into the semiconductor substrate using the gate electrode and the spacers as a mask at a first dosage and a first energy, thereby forming heavily-doped regions in the semiconductor substrate;

d) implanting second dopant ions into the semiconductor substrate using the gate electrode and the spacers as a mask at a second dosage lower than aid first dosage and a second energy higher than said first energy, thereby forming lightly-doped regions below said heavily doped regions in the semiconductor substrate after the step c) has been performed, e) selectively removing the spacers so as to leave the oxide layer on the sidewall; and the top of the gate electrode alter the step d) has been performed; and f) implanting third dopant ions into the semiconductor substrate using the gate electrode and the oxide layer as a mask, thereby forming lightly-doped regions adjacent said heavily doped regions in the semiconductor substrate after the step e) has been performed.

16. The method of claim 15, further comprising:

g) depositing an insulating film over the substrate so as cover at least the gate electrode and the oxide layer after the step f) has been performed;

h) etching the insulating film to form therein openings reaching the heavily-doped regions;

i) filling the openings in with plug electrodes made of a conductive material; and j) depositing a passivation layer over the substrate after the step i) has been performed.

17. A method for fabricating a semiconductor device, comprising the steps of:

a) forming a gate oxide layer, a gate electrode having a top surface and sidewalls, and an oxide layer on the top surface and sidewalls of the gate electrode in this order on a semiconductor substrate;

b) implanting first dopant ions into the semiconductor substrate using the gate electrode and the oxide layer as a mask, thereby fanning lightly-doped regions in the semiconductor substrate;

c) depositing a dielectric layer over the substrate and etching the dielectric layer such that spacers are formed adjacent respective sides of the gate electrode on the oxide layer and leaving the oxide layer on the top surface of the gate electrode thereon after the step b) has been performed;

d) implanting second dopant ions into the semiconductor substrate using the gate electrode and the spacers as a mask at a first dosage and a first energy, thereby forming heavily-doped regions in the semiconductor substrate; and e) implanting third dopant ions into the semiconductor substrate using the gate electrode and the spacers as a mask at a second dosage lower than said first dosage and a second energy higher than said first energy, thereby forming deeper-doped regions which extend below said heavily doped regions in the semiconductor substrate.

18. The method of claim 17, further comprising:

f) depositing an insulating film over the substrate so as cover at least the gate electrode and the oxide layer after the step a) has been performed;

g) etching the insulating film to form therein openings reaching the heavily-doped regions;

h) filling the openings in with plug electrodes made of a conductive material; and i) depositing a passivation layer over the substrate after the step h) has been performed.

* * * * *

UNITED STATES PATENT AND TRADEMARK OFFICE
CERTIFICATE OF CORRECTION

PATENT NO. : 6,767,778 B2
DATED : July 27, 2004
INVENTOR(S) : Wang et al.

It is certified that error appears in the above-identified patent and that said Letters Patent is hereby corrected as shown below:

Column 3,
Line 42, "filly" should read -- fully --

Column 7,
Line 16, "the second dopant are selected from the group consisting of phosphorus, arsenic and" should read -- the second dopant are selected from the group consisting of phosphorus, arsenic and antimony. --
Line 28, "I B 16" should read -- I E 16 --

Column 8,
Line 4, "1 B 12 to about 1 B 14" should read -- 1 E 12 to about 1 E 14 --
Line 9, "manic," should read -- arsenic, --
Line 60, "c) implanting first into" should read -- implanting first dopant ions into --
Line 66, "d) "aid" should read -- said --

Column 9,
Line 3, "performed," should read -- performed; --

Column 10,
Line 24, "step a)" should read -- step e) --

Signed and Sealed this

Twenty-second Day of March, 2005

JON W. DUDAS
*Director of the United States Patent and Trademark Office*